United States Patent
Roitman et al.

[11] Patent Number: 5,965,280
[45] Date of Patent: Oct. 12, 1999

[54] PATTERNED POLYMER ELECTROLUMINESCENT DEVICES BASED ON MICROLITHOGRAPHIC PROCESSES

[75] Inventors: Daniel B. Roitman, Menlo Park; James R. Sheats, Palo Alto, both of Calif.; Guillermo Bazan; Michelle Lee Renak, both of Rochester, N.Y.

[73] Assignee: Hewlett-Packard Company, Palo Alto, Calif.

[21] Appl. No.: 08/813,962

[22] Filed: Mar. 3, 1997

[51] Int. Cl.$^6$ .............................................. B32B 9/00
[52] U.S. Cl. ........................... 428/690; 428/917; 313/504; 313/506
[58] Field of Search .................... 428/690, 917; 313/504, 506

[56] References Cited

U.S. PATENT DOCUMENTS

| | | | |
|---|---|---|---|
| 5,326,675 | 7/1994 | Niki et al. | 430/326 |
| 5,473,047 | 12/1995 | Shi | 528/310 |
| 5,747,182 | 5/1998 | Friend et al. | 428/690 |
| 5,804,917 | 9/1998 | Takahashi et al. | 313/504 |
| 5,807,627 | 9/1998 | Friend et al. | 428/690 |

FOREIGN PATENT DOCUMENTS

| | | |
|---|---|---|
| 02120366 | 5/1990 | Japan . |
| 03105894 | 5/1991 | Japan . |
| 04067596 | 3/1992 | Japan . |
| 08213172 | 8/1996 | Japan . |

*Primary Examiner*—John M. Cooney, Jr.

[57] ABSTRACT

A PPV based electroluminescent device and method for constructing the same. The electroluminescent device is constructed on a substrate by depositing a layer of material having a PPV precursor and photoacid generator on the substrate. The substrate typically includes the anode for the device. The PPV precursor is converted to PPV in the presence of an acid. The photoacid generator produces an acid when exposed to electromagnetic radiation. Those portions of the layer that are not to contain electroluminescent elements are masked. The unmasked portion is then illuminated with electromagnetic radiation; and any unreacted PPV precursor is removed to provide a plurality of isolated PPV regions on the substrate. An electron transport layer is then deposited over the PPV regions and the cathode is deposited on top of the electron transport layer. By properly choosing the thickness of the electron transport layer, the electron transport layer also provides electrical isolation between the anode and cathode in the regions of the device that do not include PPV elements.

10 Claims, 4 Drawing Sheets

PATTERNED POLYMER ELECTROLUMINESCENT DEVICES BASED ON MICROLITHOGRAPHIC PROCESSES

FIELD OF THE INVENTION

The present invention relates to electroluminescent devices, and more particularly, to light emitting devices based on organic polymers.

BACKGROUND OF THE INVENTION

Polymer-based electroluminescent devices PLEDs) have the potential for providing inexpensive alternatives to alphanumeric displays and x-y addressable displays. PLEDs also have the potential to provide an alternative to back lighted liquid crystal displays. A simple PLED may be constructed from an electroluminescent layer sandwiched between an electron injection electrode and a hole injection electrode. More complicated devices utilize electron and hole transport layers between the above mentioned electrodes and the electroluminescent layer. Devices based on poly(p-phenylenevinylene) (PPV), or derivatives thereof, have been demonstrated with sufficient quantum yields to be commercially attractive.

A display based on PLEDs is typically constructed by spin casting one or more polymer layers on an electrode structure. An electron transport layer and the second electrode are then deposited on the PPV layer. Individually addressable devices are obtained by patterning the electrodes and electron transport layers. All of the devices typically share a common PPV layer.

While this mode of fabrication is useful in generating devices which all emit at the same wavelength, it is less than ideal for devices in which the PLEDs are to emit at different wavelengths. For example, color displays may be constructed by constructing each pixel from three color pixels placed close to one another. To obtain pixels with different colors, prior art devices utilize an electroluminescent layer that has been doped to produce a broad emission spectrum. Color filters are then used to convert this one color display into a tri-color display. While a multi-color display can be fabricated in this manner, only a fraction of the available light can be realized at each color; hence, the intensity is less than that achievable with a monochrome display. In addition, the color filters must be fabricated and patterned on each element which increases the cost of the display.

It would be advantageous to be able to pattern PPV layers photolithographically. PLEDs could then be constructed using the well developed techniques utilized in the manufacture of integrated circuits.

Broadly, it is the object of the present invention to provide an improved PLED.

It is a further object of the present invention to provide a photolithographic method for patterning PLEDs.

These and other objects of the present invention will become apparent to those skilled in the art from the following detailed description of the invention and the accompanying drawings.

SUMMARY OF THE INVENTION

The present invention comprises a PPV based electroluminescent device and a method for constructing the same. According to the present invention, an electroluminescent device is constructed on a substrate by depositing a layer of material having a PPV precursor and photoacid generator on the substrate. The substrate typically includes the anode for the device. The PPV precursor is converted to PPV in the presence of an acid. The photoacid generator produces an acid when exposed to electromagnetic radiation. Those portions of the layer that are not to contain electroluminescent elements are masked. The unmasked portion is then illuminated with electromagnetic radiation; and any unreacted PPV precursor is removed to provide a plurality of isolated PPV regions on the substrate. An electron transport layer is then deposited over the PPV regions and the cathode is deposited on top of the electron transport layer. By properly choosing the thickness and material utilized to construct the electron transport layer, the electron transport layer also provides electrical isolation between the anode and cathode in the regions of the device that do not include PPV elements.

DETAILED DESCRIPTION OF THE INVENTION

The present invention is based on the acid conversion of a precursor material to conjugated PPV. The acid is generated upon photolysis of an acid precursor that is mixed with PPV precursor. Hence, the PPV can be patterned microlithographically by depositing a layer of the mixture of PPV precursor and acid precursor and then exposing the areas in which the PPV is to be generated to light of the appropriate wavelength and intensity. The precursor that is not converted to PPV is then removed.

Figure 1:
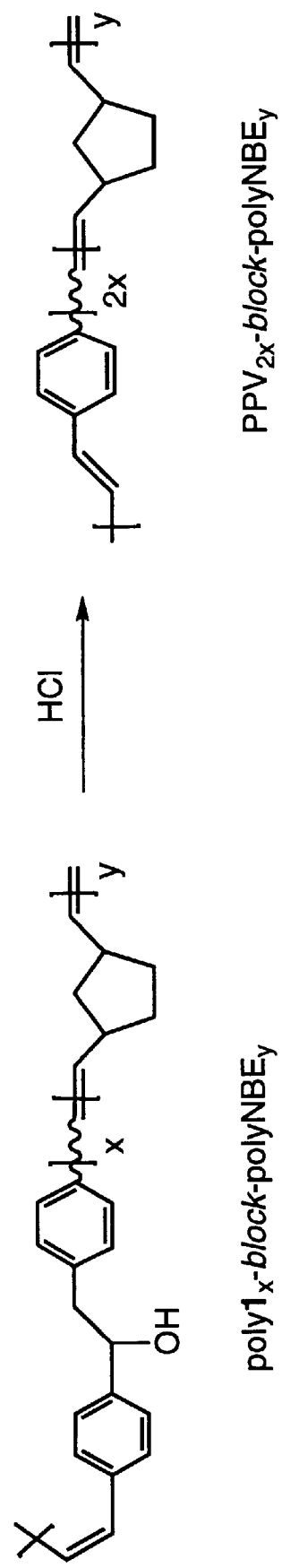
FIG. 1 illustrates the basic chemistry utilized in the preferred embodiment of the present invention.

Refer now to FIG. 1 which illustrates the basic chemistry utilized in the preferred embodiment of the present invention. In the preferred embodiment of the present invention, the PPV is incorporated into a block copolymer to allow the control of properties such as solubility and viscosity. The PPV precursor is preferably poly(9-hydroxy-[2.2]paracyclophan-1-ene)$_x$-block-poly(norbornene)$_y$ (poly1$_x$-block-polyNBE$_y$). Here, the subscripts refer to the average degree of polymerization and the abbreviation NBE is used for norbomnene. This precursor converts to PPV$_{2x}$-block-polyNBE$_y$ at 50–60° C. in the presence of acid. The preferred photoacid generator is triphenylsulfonium trifluoromethanesulfonate.

Figure 2:
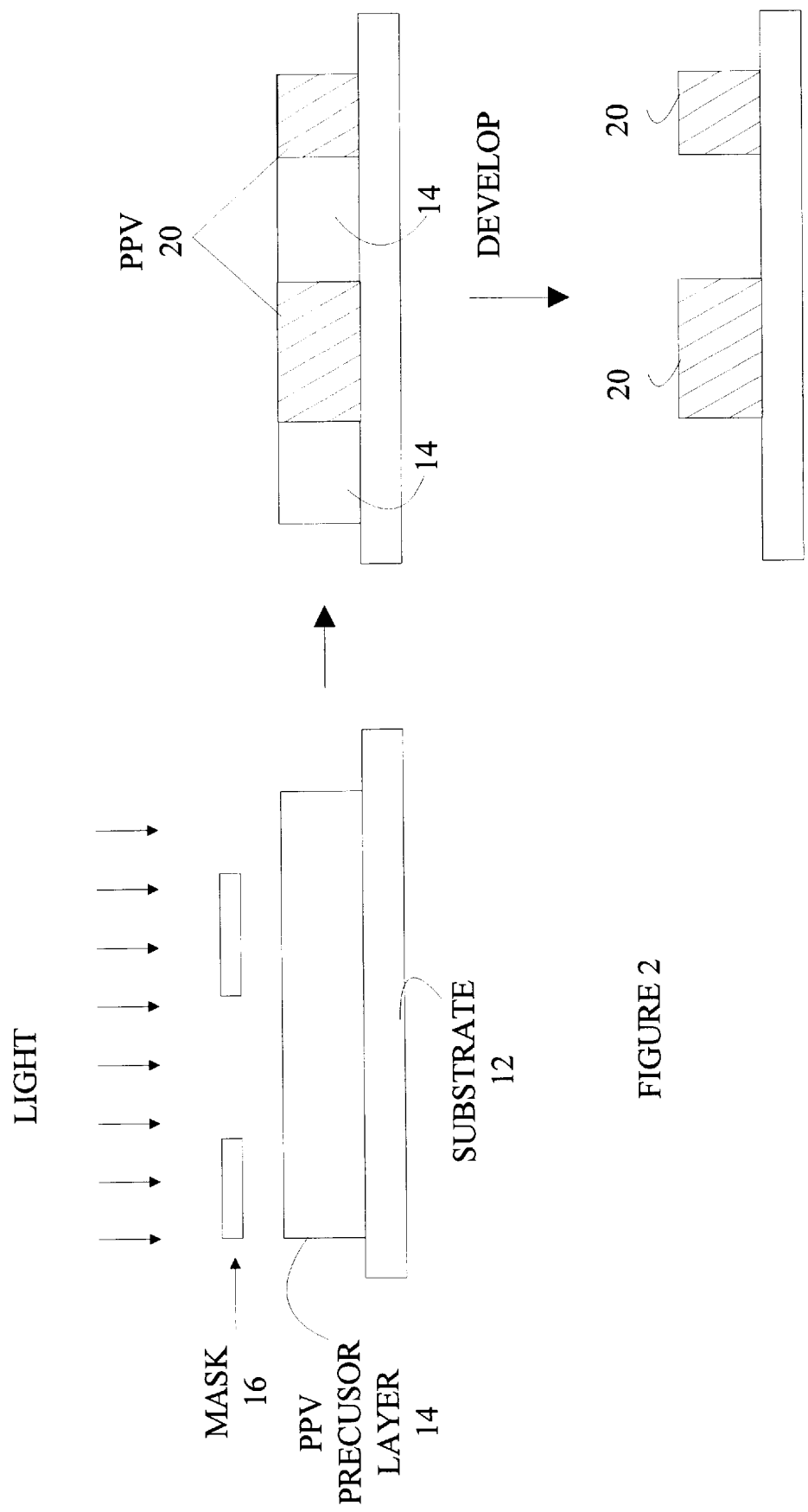
FIG. 2 illustrates the microlithographic generation of patterned PPV on a substrate.

Refer now to FIG. 2 which illustrates the microlithographic generation of patterned PPV on a substrate. First, a uniform film 14 containing poly1$_x$-block-polyNBE$_y$ and the photoacid generator is spin cast from a toluene and methylene chloride solution (95:5) onto a glass substrate 12. Irradiation through a mask 16 at an exposure dose of 4.7 J/cm$^2$ with light from a mercury lamp promotes the formation of triflic acid which generates PPV regions 20 in the exposed locations. Converted areas correspond only to irradiated regions and are immediately distinguishable by virtue of their emission in the visible region. Development in chloroform cleanly washes away unreacted poly1$_x$-block-polyNBE$_y$ leaving the patterned PPV regions 20.

The ratio of PPV to polyNBE in the precursor blocks can be tuned to optimize the development step. A larger percentage of the polyNBE component increases solubility to a point where irradiated areas dissolve in chloroform.

Conversely, it is difficult to completely remove $poly1_x$-block-$polyNBE_y$ when x is much greater than y, e.g., when the ratio x/y is more than about 15. Acceptable results are obtained when the ratio x/y is in the range $0.5 \leq x/y \leq 2$, and optimum results are obtained when the ratio x/y is in the range $1 \leq x/y \leq 2$.

LEDs based on PPVs typically utilize an electron transport layer (ETL) to assist the injection of electrons from the cathode material into the PPV. A typical LED is a two layer structure consisting of a PPV layer in contact with an ETL. This two layer structure is sandwiched between an anode and a cathode, with the ETL layer in contact with the cathode. In principle, the ETL can be patterned on top of the PPV and an insulator deposited between LEDs to prevent contact between the anode and cathode in LED arrays. However, this configuration requires additional mask steps to pattern the ETL. Such steps decrease the device yield, and hence, increase the cost of LED arrays based on PPV.

Figure 3:
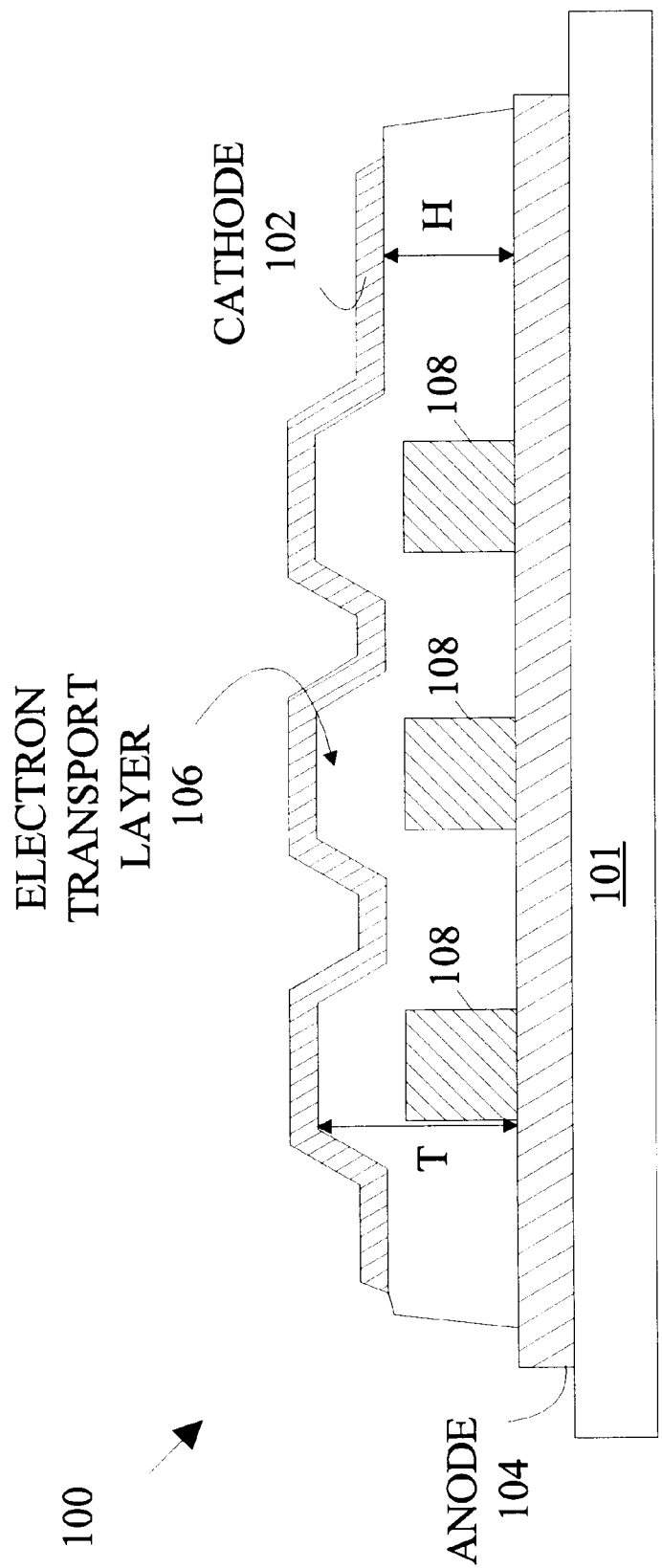
FIG. 3 is a cross-sectional view of an LED array 100 according to the present invention.

The present invention makes use of the observation that the ETL can be used both to provide the electron injection function discussed above and to insulate the anode from the cathode, provided the thicknesses of the PPV and ETL are chosen properly. Refer now to FIG. 3 which is a cross-sectional view of an LED array 100 according to the present invention. Array 100 is constructed by depositing an anode 104, typically a layer of indium tin oxide, on a substrate 101. Patterned PPV elements 108 are then deposited on anode 104 using the methodology described above. An electron transport layer 106 is then deposited over the PPV elements. The electron transport layer (ETL) may be cast from a solution containing polystyrene and 2-(4-biphenylyl)-1,3,4 oxadiazole (50:50 by weight composition). Typical film thicknesses are 220 nm for the ETL and 80–100 nm for the PPV patterns. The cathodic contact, typically Ca, is deposited through shadow masks in the appropriate configuration.

Ideally the ETL is expected to carry electrons from the cathode to the emissive PPV layer while blocking the flow of holes from the anode towards the cathode in the areas not covered by the PPV layer 108. In practice, hole blocking films are not perfect and under sufficiently high fields holes will be injected into the ETL where they may recombine with electrons and give off light. Since the thickness, H, of the ETL is less than the combined thickness, T, of the PPV and ETL, the electric field must be higher in the regions outside the PPV elements. This assumes that the dielectric constants in the PPV and ETL regions are approximately the same. The larger this difference, the higher the probability that holes will be injected into the ETL-only region. For the devices described above, H and T must be chosen such that $H/(T+H)>0.5$ to prevent current from passing through the regions covered only by ETL. If this condition is satisfied, then an unpatterned ETL may be utilized for both the electron transport function and the electrical isolation of the cathode and anode. However, it should be noted that this condition, in general, depends on the materials used for the ETL and electrodes.

Figure 4:
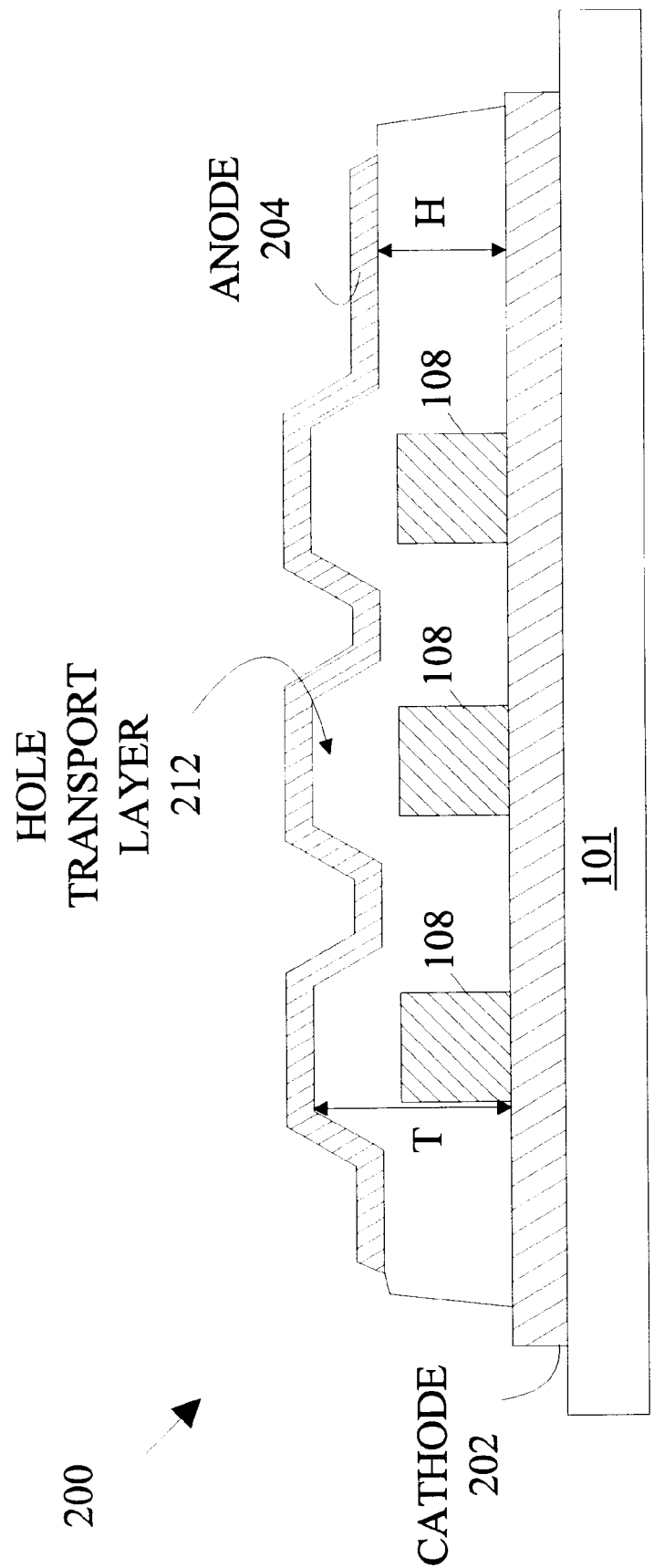

The embodiment shown in FIG. 3 utilized an ETL for both carrier injection and electrical isolation of the cathode and anode in those regions in which the cathode and anode were not separated by the PPV. However, it will be apparent to those skilled in the art from the above discussion that embodiments which utilize a hole transport layer in an analogous manner may also be constructed according to the present invention. Such an arrangement is shown in FIG. 4 at 200. Those elements shown in FIG. 4 which serve the same function as elements shown in FIG. 3 have been given the same numerical designations in FIG. 4 as used in FIG. 3. The hole transport layer 212 replaces the ETL shown in FIG. 3 and the positions of the anode 204 and cathode 202 reversed compared to the embodiment shown in FIG. 3. If H and T are properly chosen, the hole transport layer will also provide electrical isolation between the anode and cathode in those regions in which the cathode and anode are not separated by PPV. The specific relationship between H and T will, of course, depend on the hole transport layer material as well as the materials from which the anode and cathode are constructed.

Various modifications to the present invention will become apparent to those skilled in the art from the foregoing description and accompanying drawings. Accordingly, the present invention is to be limited solely by the scope of the following claims.

What is claimed is:

1. A method for constructing an electroluminescent device on a substrate, said method comprising the steps of:

depositing a layer of material comprising a PPV (poly(p-phenylenevinylene)) precursor and photoacid generator, said PPV precursor being converted to PPV in the presence of an acid, said photoacid generator producing an acid when exposed to electromagnetic radiation;

masking a portion of said layer leaving a portion of said layer unmasked;

illuminating said unmasked portion of said layer with electromagnetic radiation; and removing any unreacted PPV precursor to provide a plurality of isolated PPV regions on said substrate.

2. The method of claim 1 wherein said PPV precursor comprises poly(9-hydroxy-[2.2]-paracylophan-1-ene)$_x$-block-poly(norbornene)$_y$ ($poly1_x$-block-$polyNBE_y$.

3. The method of claim 1 wherein said photoacid generator comprises triphenylsulfonium trifuoromethanesulfonate.

4. The method of claim 1 further comprising the step of depositing an electron transport layer on said isolated PPV regions, said electron transport layer covering said PPV regions and filling any space between said PPV regions, said electron transport layer comprising a material that preferentially transports electrons over holes.

5. The method of claim 4 wherein said electron transport layer comprises polystyrene and 2-(4-biphenylyl)-1,3,4oxadiazole.

6. An electroluminescent display comprising:

an anode;

a plurality of isolated PPV regions in contact with said anode;

an electron transport layer covering said PPV regions and filling the spaces between said PPV regions; and a cathode comprising a layer deposited on said electron transport layer, said electron transport layer isolating said cathode from said anode.

7. The display of claim 6 wherein said electron transport layer is deposited such that the minimum distance between skid anode and cathode in regions in which said cathode overlies said anode is greater than a predetermined distance that depends on the distance between anode and cathode in those regions in which said cathode overlies said PPV regions and on the materials from which said anode, cathode, and electron transport layer are constructed.

8. The display of claim 6 wherein said electron transport layer comprises polystyrene and 2-(4-biphenylyl)-1,3,4oxadiazole.

9. An electroluminescent display comprising:

a cathode;

a plurality of isolated PPV regions in contact with said cathode;

a hole transport layer covering said PPV regions and filling the spaces between said PPV regions; and an anode comprising a layer deposited on said hole transport layer, said hole transport layer isolating said cathode from said anode.

10. The display of claim 9 wherein said hole transport layer is deposited such that the minimum distance between said anode and cathode in regions in which said anode overlies said cathode is greater than a predetermined distance that depends on the distance between anode and cathode in those regions in which said anode overlies said PPV regions and on the materials from which said anode, cathode, and hole transport layer are constructed.

* * * * *